(12) United States Patent
Drakshapalli et al.

(10) Patent No.: US 11,782,101 B2
(45) Date of Patent: Oct. 10, 2023

(54) HALL SENSOR-BASED DATA ACQUISITION SYSTEM

(71) Applicant: Cirrus Logic International Semiconductor Ltd., Edinburgh (GB)

(72) Inventors: Prashanth Drakshapalli, Austin, TX (US); John L. Melanson, Austin, TX (US); Anindya Bhattacharya, Austin, TX (US); Seung Bae Lee, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 427 days.

(21) Appl. No.: 16/987,257

(22) Filed: Aug. 6, 2020

(65) Prior Publication Data

US 2022/0043077 A1 Feb. 10, 2022

(51) Int. Cl.
*G01R 33/07* (2006.01)
*H03M 3/00* (2006.01)
*H03M 1/38* (2006.01)

(52) U.S. Cl.
CPC .............. *G01R 33/07* (2013.01); *H03M 1/38* (2013.01); *H03M 3/458* (2013.01)

(58) Field of Classification Search
CPC ....................................................... G01R 33/07
See application file for complete search history.

(56) References Cited

U.S. PATENT DOCUMENTS

| | | | |
|---|---|---|---|
| 2,464,807 A | 3/1949 | Hansen | |
| 5,014,229 A | 5/1991 | Mofachern | |
| 5,089,979 A | 2/1992 | McEachern et al. | |
| 5,557,267 A | 9/1996 | Poduje et al. | |
| 7,859,269 B1 | 12/2010 | Laraia et al. | |
| 9,804,249 B2 | 10/2017 | Petrie et al. | |
| 10,690,730 B2 | 6/2020 | Kimball | |
| 2006/0213270 A1 | 9/2006 | O'Dowd et al. | |
| 2007/0247141 A1 | 10/2007 | Pastre et al. | |
| 2009/0001981 A1 | 1/2009 | Rengachar | |
| 2019/0293688 A1 | 9/2019 | Disselnkoetter et al. | |
| 2021/0275822 A1* | 9/2021 | Shah | A61N 1/3925 |
| 2022/0045689 A1 | 2/2022 | Lee et al. | |

FOREIGN PATENT DOCUMENTS

| | | |
|---|---|---|
| EP | 3422033 A1 | 1/2019 |
| WO | 2018044408 A1 | 3/2018 |

OTHER PUBLICATIONS

Mosser, Vincent et al. "A Spinning Current Circuit for Hall Measurements Down to the Nanotesla Range." *IEEE Transactions on Instrumentation and Measurement.* vol. 66, No. 4, Apr. 2017. pp. 637-650.

* cited by examiner

*Primary Examiner* — Alesa Allgood
(74) *Attorney, Agent, or Firm* — E. Alan Davis; Huffman Law Group, PC

(57) ABSTRACT

A data acquisition system (DAS) for acquiring data from a Hall effect sensor includes one or more state variables, a multiplexer that periodically rotates a signal from the Hall effect sensor, and a controller that resets the one or more state variables in synchronization with rotation of the signal. The state variables may be digital states in a digital memory or voltages of capacitors the controller forces to a reset voltage. The state variables may be included in a noise-shaping SAR ADC, a delta-sigma ADC, a digital filter, an integrator, an analog filter, a VCO, an incremental ADC or an auxiliary ADC-assisted incremental ADC, or an auxiliary ADC of the DAS.

18 Claims, 7 Drawing Sheets

HALL SENSOR-BASED DATA ACQUISITION SYSTEM

BACKGROUND

The field of representative embodiments of this disclosure relates to methods, devices, and circuits concerning Hall sensor-based data acquisition systems.

A typical Hall sensor-based data acquisition system, as shown in FIG. 1 (and as disclosed in Mosser V., Matringe N. and Haddab Y., "A spinning current circuit for Hall measurement down to the nanotesla range", IEEE T. Instrum. Meas., vol. 66, pp. 637-650, April 2017), has a Hall Element 104, an integrated data acquisition integrated circuit (IC), and a processor (e.g., a microcontroller 118 that is in communication with a personal computer (PC) 122). A typical data acquisition IC has a current source 102 to bias the Hall element 104, a differential amplifier or pseudo-differential amplifier 112, and an analog-to-digital converter (ADC) 116 to acquire the voltage developed across the output terminals. The data acquisition IC may also include filtering 114 between the amplifier 112 and ADC 116. A typical Hall element 104 suffers from offset voltages and a common technique used to reduce the impact of the offset is Spinning Current Modulation. As part of this technique, the bias current, the Hall element ground (GND), and the two output terminals exchange roles periodically, and thereby a DC offset in the Hall element 104 gets converted into a high frequency tone at the rotation rate. To support this role exchange, often a multiplexer 106 is built into the front-end of the amplifier 112. The multiplexer 106 (e.g., connected to the Hall element 104 via an interconnect cable 108) can rotate the four terminals of the Hall element 104 to up-covert the DC offset. This technique is a very effective way of getting rid of the offsets in the Hall element 104, but such a technique imposes a severe challenge on the system to limit the out of band interference on the Hall terminal. Any signal at a frequency higher than the multiplexer 106 rotation rate can fold back into the signal band either because of rotation or because of chopping techniques used in the differential amplifier 112 or the ADC 116.

As discussed above, the rotation artifact reduces the low frequency offset of the Hall element, but the rotation artifact compounds the system level integration tasks. Any high frequency signal (frequency higher than the rotation rate) that couples to the Hall element 104 output terminals get mixed (down-converted) to low frequencies and may even show up as in-band tones, thereby degrading the signal-to-noise ratio (SNR) of the data path. Traditionally, this problem has been addressed by appropriately frequency planning the rotation rate, while paying attention to the frequency content of the aggressor signal (i.e., the high frequency signal above the rotation rate). Such a technique works well for single-tone aggressors.

To illustrate by way of example, assume an aggressor at 500 kHz differentially coupled to the output terminals of the Hall element 104. The rotation rate can be set to 90 kHz, and the aggressor signal may fold back to ~45 kHz which may be outside the bandwidth of interest. However, such a method may not work well if multiple aggressor signals exist.

In addition, offset and 1/f noise in the differential amplifier 112 in the IC has to be either designed to be a very low value, or the amplifier 112 has to be chopped to up-convert the offset and 1/f noise to frequencies higher than the bandwidth of interest. Such considerations pose an interesting challenge, because the output spectrum of the multiplexer 106 has signals at very high frequencies. Therefore, special attention must be given while designing the chopping circuits to make sure that nothing folds back from high frequencies to signal bands.

SUMMARY

In one embodiment, the present disclosure provides a data acquisition system (DAS) for acquiring data from a Hall effect sensor. The DAS includes one or more state variables, a multiplexer that periodically rotates a signal from the Hall effect sensor, and a controller that resets the one or more state variables in synchronization with rotation of the signal. The state variables may be digital states in a digital memory or voltages of capacitors the controller forces to a reset voltage. The state variables may be included in a noise-shaping SAR ADC, a delta-sigma ADC, a digital filter, an integrator, an analog filter, a VCO, an incremental ADC or an auxiliary ADC-assisted incremental ADC, or an auxiliary ADC of the DAS.

In another embodiment, the present disclosure provides a method for acquiring data from a Hall effect sensor using a data acquisition system (DAS) that includes periodically rotating a signal from the Hall effect sensor and resetting one or more state variables of the DAS in synchronization with rotation of the signal.

BRIEF DESCRIPTION OF THE DRAWINGS

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

DETAILED DESCRIPTION

Embodiments of the present disclosure relate to apparatus and methods used to accurately capture the electrical signals from Hall elements in the presence of high frequency interference signals.

As described earlier, the Hall element has offset and low frequency noise, which if not modulated to a frequency higher than the signal band, would degrade the accuracy of the measured voltage. While rotating the Hall element terminals up-converts the low frequency offset and noise of the Hall element, the high frequency noise gets down converted. A method according to embodiments of the present disclosure for mitigating the downside of the rotation is to employ a method of data acquisition, wherein the amplifier and the ADC has been reset upon every rotation, thereby removing memory from the data acquisition system upon rotation of the Hall element. The removal of memory from the data acquisition system upon rotation of the Hall element is equivalent to synthesizing a zero in the signal transfer function at every multiple of the rotation frequency, which advantageously may be appropriately placed to attenuate the interfering signals.

Figure 1:
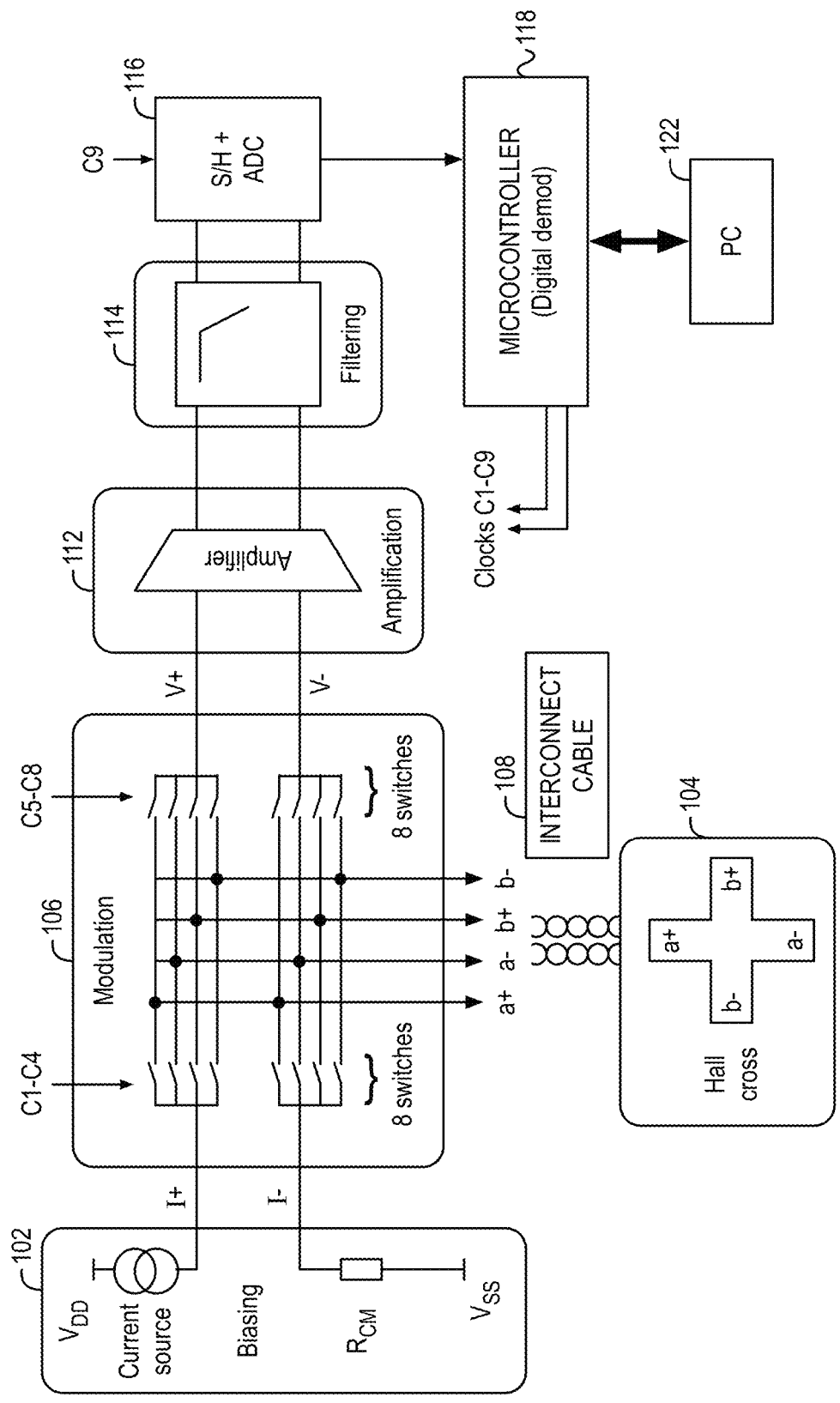
FIG. 1 is an example typical Hall sensor-based data acquisition system.
Figure 2:
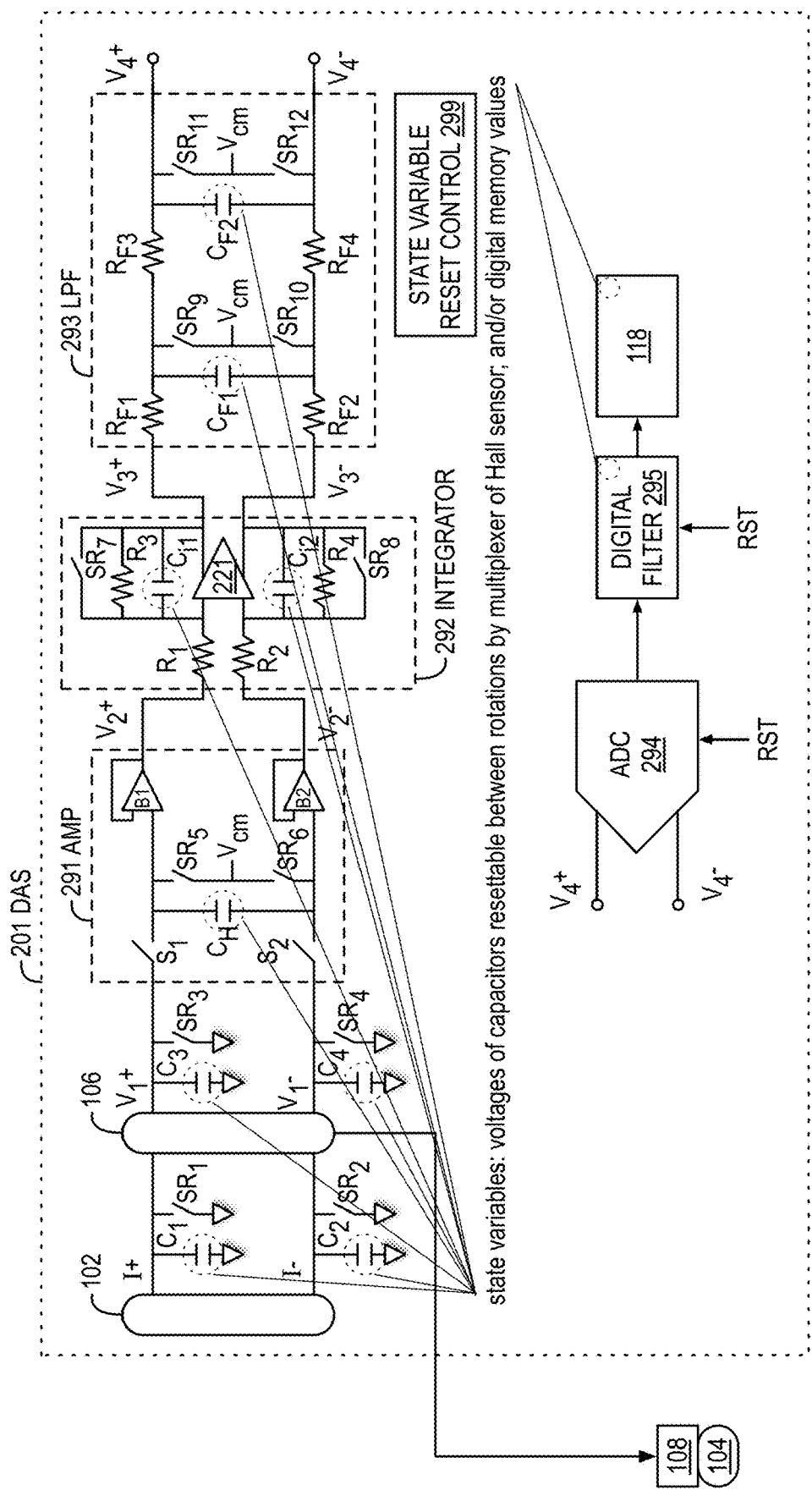
FIG. 2 is an example DAS for acquiring data from a Hall effect sensor in accordance with embodiments of the present disclosure.

FIG. 2 is an example DAS for acquiring data from a Hall effect sensor in accordance with embodiments of the present disclosure. The DAS 201 includes a biasing source 102 and a multiplexer 106, such as described with respect to FIG. 1. The Hall sensor 104 is connected to the biasing source 102 through the multiplexer 106 and through an interconnect cable 108, such as also described with respect to FIG. 1. The DAS 201 also includes an amplifier 291 that receives a differential sensor voltage $V_1$ (shown as $V_1+$ and $V_1-$ in FIG. 2) from the multiplexer 106 and outputs a differential voltage $V_2$ (shown as $V_2+$ and $V_2-$ in FIG. 2). An integrator 292 integrates the output voltage $V_2$ of the amplifier 291 to generate a differential integrated voltage $V_3$ (shown as $V_3+$ and $V_3-$ in FIG. 2). A low pass filter (LPF) 293 filters the integrated voltage $V_3$ to generate a filtered voltage $V_4$ (shown as $V_4+$ and $V_4-$ in FIG. 2). An analog-to-digital converter (ADC) 294 digitizes the filtered voltage $V_4$ to generate a digital value that a digital filter 295 filters before provision to a microcontroller 118, e.g., a digital signal processor (DSP). Finally, the DAS 201 includes a reset control 299 that resets state variables of the DAS 201 as described in more detail below. The reset control 299 may be a state machine, a state machine programmed by the microcontroller 118, or the microcontroller 118 itself. The reset control 299 may be part of a timing chain of the DAS 201.

The DAS 201 includes state variables. The state variables may be voltages of capacitors and/or values stored in a digital memory, e.g., registers or random access memory. In the embodiment of FIG. 2, state variables include voltages of capacitors $C_1$, $C_2$, $C_3$, $C_4$, $C_H$, $C_{i1}$, $C_{i2}$, $C_{F1}$, and $C_{F2}$ that may be reset by the reset control 299 via reset switches SR1 through SR12 in synchronization with rotation of the Hall sensor 104 by the multiplexer 106 (e.g., between rotation phases). In the embodiment of FIG. 2, state variables may also include digital values held in a memory, e.g., of digital filter 295 or processor 118, that may be reset by a reset signal RST, in synchronization with rotation of the Hall sensor 104 (e.g., between rotation phases). Furthermore, the ADC 294 may include state variables, e.g., state of an integrator 345, state of a quantizer 347, and state of a feedback digital-to-analog converter (DAC) 349 of FIG. 3, that may be reset by the reset control 299 in synchronization with rotation of the sensor 104 (e.g., between rotation phases).

Capacitors $C_1$, $C_2$ are coupled between respective outputs of the biasing source 102 and ground and may be reset to a ground voltage via respective reset switches $SR_1$ and $SR_2$. Capacitors $C_3$, $C_4$ are coupled between respective outputs of multiplexer 106 and ground and may be reset to a ground voltage via respective reset switches $SR_3$ and $SR_4$. Capacitors $C_1$, $C_2$, $C_3$, $C_4$ may be explicit capacitors or parasitic capacitors. Although shown as part of the DAS 201 in FIG. 2, the capacitors $C_1$, $C_2$, $C_3$, $C_4$ may be part of the Hall sensor 104 and/or a printed circuit board or other substrate upon which the DAS 201 and sensor 104 are integrated.

The amplifier 291 includes input switches $S_1$ and $S_2$ that receive the respective sensor voltages $V_1+$ and $V_1-$ and a hold capacitor $C_H$ connected to the input switches $S_1$ and $S_2$. The amplifier 291 includes buffers B1 and B2 that generate the respective output voltages $V_2+$ and $V_2-$. The buffers B1 and B2 may be unity gain buffers or may be gain stages have gain greater than one. The input to B1 is connected to a common mode voltage $V_{cm}$ by a reset switch $SR_5$, and the input to B2 is connected to a common mode voltage $V_{cm}$ by a reset switch $SR_6$. Thus, reset control 299 may operate reset switches $SR_5$ and $SR_6$ to reset the state variable voltage of holding capacitor $C_H$ to the common mode voltage $V_{cm}$ in synchronization with rotation of the sensor 104 (e.g., between rotation phases).

The integrator 292 includes an op amp 221, input resistors $R_1$ and $R_2$, integrating capacitors $C_{i1}$ and $C_{i2}$, integrating resistors $R_3$ and $R_4$, and reset switches $SR_7$ and $SR_8$ in parallel with integrating capacitors $C_{i1}$ and $C_{i2}$. Thus, reset control 299 may operate reset switches $SR_7$ and $SR_8$ to reset the state variable voltage of integrating capacitors $C_{i1}$ and $C_{i2}$ in synchronization with rotation of the sensor 104 (e.g., between rotation phases).

The LPF 293 includes first loop filter resistors $R_{F1}$ and $R_{F2}$ connected on one terminal to respective outputs of integrator 292 and connected on the other terminal to respective terminals of a first loop filter capacitor $C_{F1}$. One terminal of the first loop filter capacitor $C_{F1}$ is connected to common mode voltage $V_{cm}$ by a reset switch $SR_9$, and the other terminal of the first loop filter capacitor $C_{F1}$ is connected to common mode voltage $V_{cm}$ by a reset switch $SR_{10}$. The LPF 293 also includes second loop filter resistors $R_{F3}$ and $R_{F4}$ connected on one terminal to respective terminals of first loop filter capacitor $C_{F1}$ and connected on the other terminal to respective terminals of a second loop filter capacitor $C_{F2}$. One terminal of the second loop filter capacitor $C_{F2}$ is connected to common mode voltage $V_{cm}$ by a reset switch $SR_{11}$, and the other terminal of the second loop filter capacitor $C_{F2}$ is connected to common mode voltage $V_{cm}$ by a reset switch $SR_{12}$. Thus, reset control 299 may operate reset switches $SR_9$ and $SR_{10}$ to reset the state variable voltage of the first loop filter capacitor $C_{F1}$ and reset switches $SR_{11}$ and $SR_{12}$ to reset the state variable voltage of the second loop filter capacitor $C_{F2}$ in synchronization with rotation of the sensor 104 (e.g., between rotation phases).

As shown in FIG. 2, the signal path may include a single stage amplifier followed by one or more integrators and/or filtering stages. Alternatively, the signal path may simply include a single stage amplifier. The signal path may include other elements, such as voltage-controlled oscillators (VCOs) and/or digital-to-analog converters (DACs) that include state variables that may be reset in synchronization with rotation of the Hall sensor 104 by the reset control 299 (e.g., between rotation phases). The analog and digital filters and/or the amplifiers in the DAS 201 may enhance the first-order frequency response of the DAS 201 shown in FIG. 2 to a higher order frequency response, thereby enhancing its robustness. In one embodiment, the ADC 294 may be a noise-shaping successive-approximation register (SAR) ADC having resettable state variables, such as an integrator. In another embodiment, the ADC 294 may be a delta-sigma ADC (e.g., see FIG. 3). In another embodiment, the ADC 294 may be an auxiliary ADC-assisted delta sigma ADC (e.g., see FIG. 4). When the ADC 294 is implemented as an incremental ADC, and when the ADC 294 is reset, a corresponding digital decimation filter (not shown) may also be reset. When the ADC 294 is implemented as an auxiliary ADC-assisted delta-sigma ADC (e.g., of FIG. 4) and when the delta-sigma ADC 294 is reset, its state variables (in addition to the internal state variables of the preceding stage) may be first captured by the auxiliary ADC 298 for further processing before the incremental ADC and digital filter 295 are reset.

Figure 3:
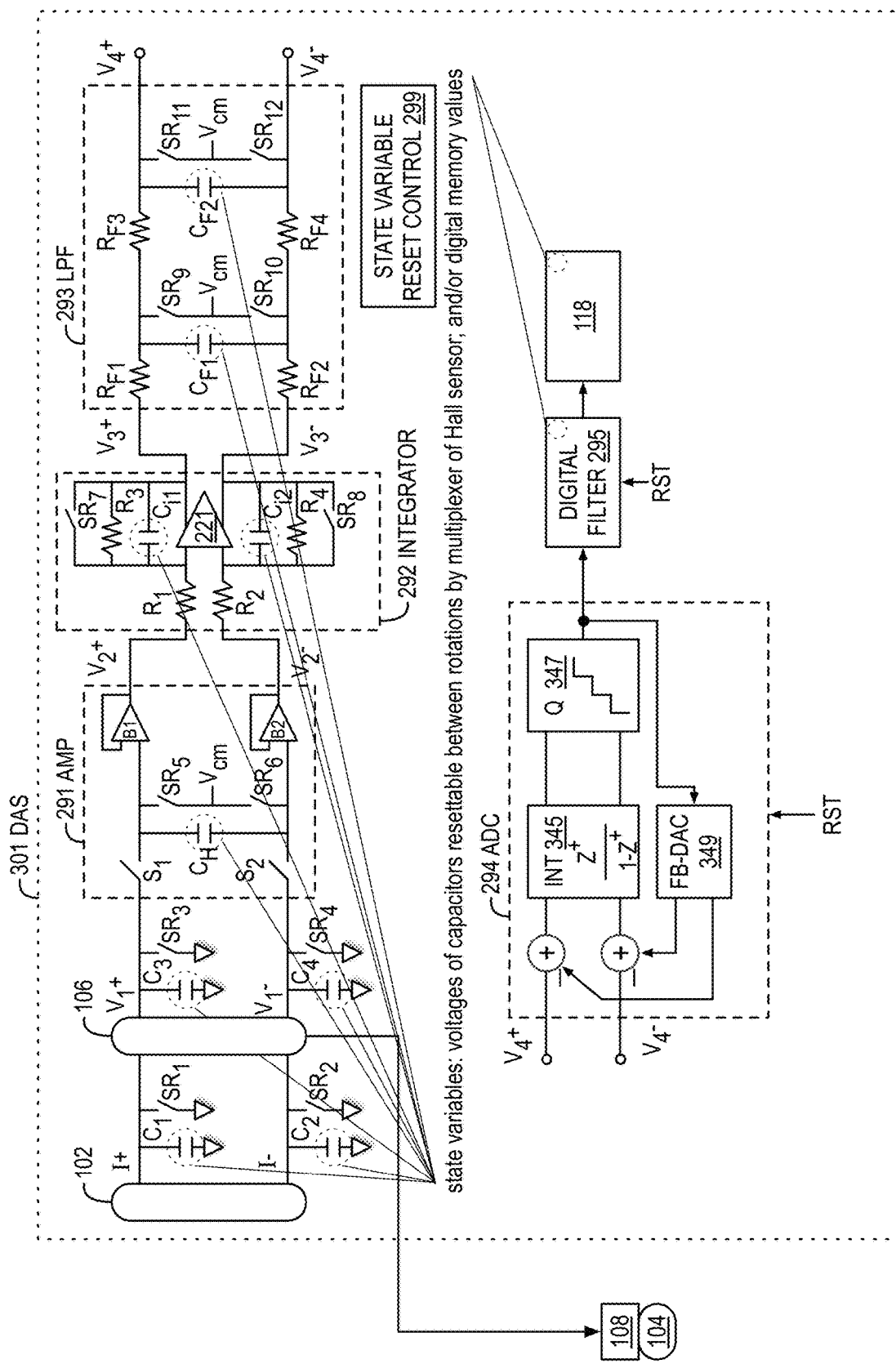
FIG. 3 is an example DAS for acquiring data from a Hall effect sensor in accordance with embodiments of the present disclosure.

FIG. 3 is an example DAS for acquiring data from a Hall effect sensor in accordance with embodiments of the present disclosure. The DAS 301 of FIG. 3 is similar in many respects to the DAS 201 of FIG. 2. However, in the embodiment of FIG. 3, the DAS 301 ADC 294 is a delta-sigma ADC. The delta-sigma ADC may be first order or higher order, and the ADC 294 may be a continuous time or a discrete time ADC. In the embodiment of FIG. 3, the delta-sigma ADC 294 includes an integrator 345, a quantizer 347, and a feedback DAC 349. The feedback DAC 349 receives the digital output of the quantizer 347 and converts it to a differential analog signal that is provided to a pair of summing elements that subtract the feedback signal from filtered voltage $V_4$, i.e., the output of the LPF 293. The integrator 345 integrates the result of the summing elements. The quantizer 347 is a multi-level quantizer that quantizes the output of the integrator 345 to generate an $N_1$ bit quantity for provision to the digital filter 295. The output of the digital filter 295 is provided to the processor 118. The number of levels of the quantizer 347 may be chosen to optimize power consumption. The order of the loop is chosen to facilitate settling of the digital filter 295 within the conversion window.

Figure 4:
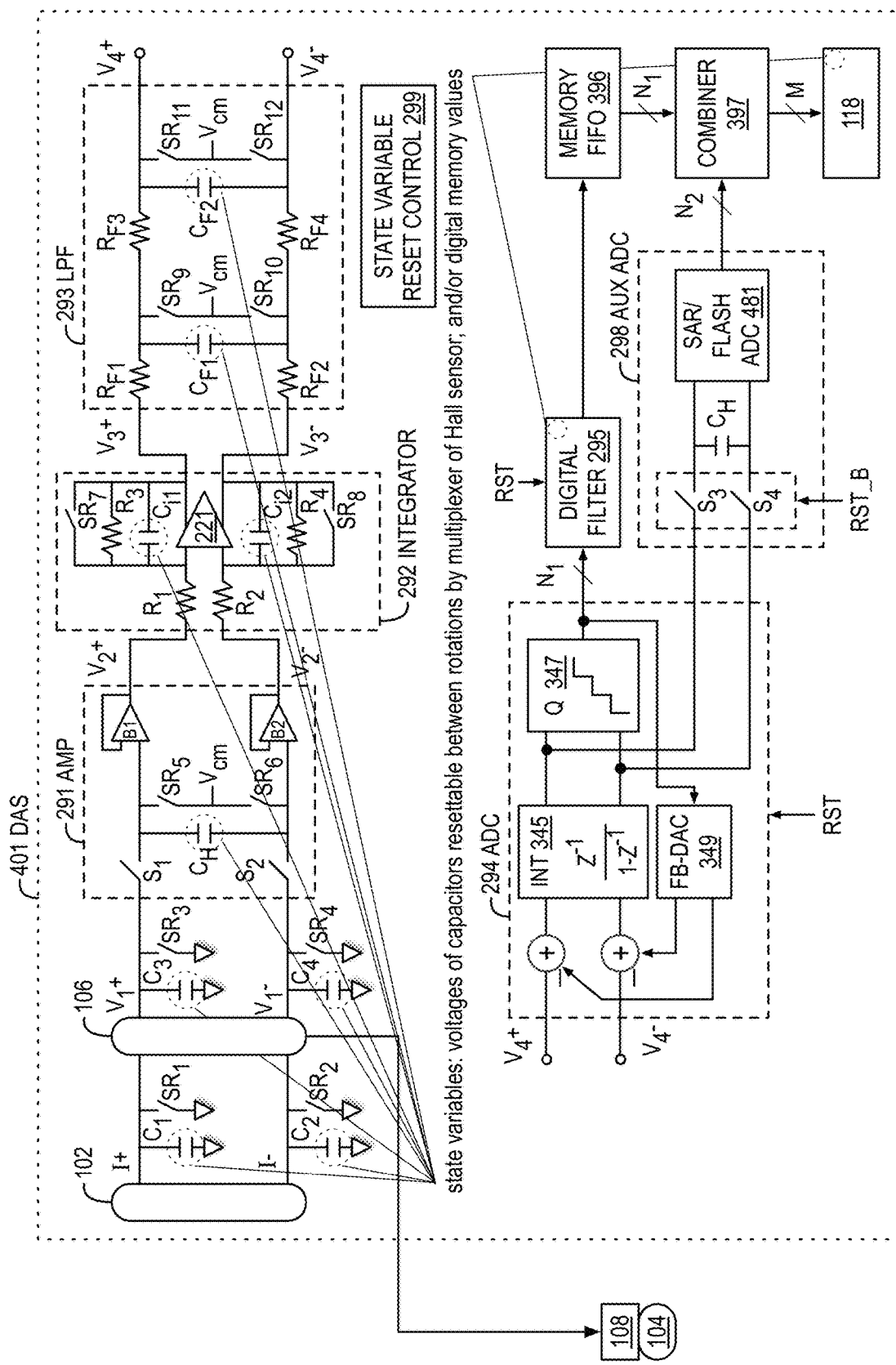
FIG. 4 is an example DAS for acquiring data from a Hall effect sensor in accordance with embodiments of the present disclosure.

FIG. 4 is an example DAS for acquiring data from a Hall effect sensor in accordance with embodiments of the present disclosure. The DAS 401 of FIG. 4 is similar in many respects to the DAS 301 of FIG. 3. However, in the embodiment of FIG. 4, the DAS 401 also includes an auxiliary ADC 298, a memory FIFO 396, and a combiner 397. In the embodiment of FIG. 4, the main ADC 294 generates an $N_1$ bit wide digital output for provision to the digital filter 295. The auxiliary ADC 298 samples the output voltage of the integrator 345 of the main ADC 294 just before the integrator 345 is reset. While the main ADC 294 is in reset, the auxiliary ADC 298 digitizes the residue to generate an $N_2$ bit wide residual digital output. The output of the digital filter 295 is provided to the memory FIFO 396 for delay. The combiner 397 combines the delayed and filtered digital output of the main ADC 294 with the $N_2$ bit wide digital output of the auxiliary ADC 298 to generate an M bit result for provision to the processor 118. In one embodiment, the combiner 397 simply adds the output of the memory FIFO 396 and the output of the auxiliary ADC 298. In another embodiment, the combiner 397 scales the output of the auxiliary ADC 298 by a scalar value before adding it to the output of the memory FIFO 396. In one embodiment, the bit widths $N_1$ and $N_2$ of the outputs of the main ADC 294 and the auxiliary ADC 298 are the same, and in other embodiments they are different. The number of levels of the quantizer 347 may be chosen to optimize power consumption. The order of the loop is chosen to facilitate settling of the digital filter 295 within the main signal path conversion window.

The auxiliary ADC 298 may be used to obtain a faster response. The auxiliary ADC 298 may be any low latency ADC that is able to output a fully settled value within the reset duration described below with respect to the timing diagram of FIG. 5A or FIG. 5B. In the embodiment of FIG. 4, the auxiliary ADC 298 includes switches $S_3$ and $S_4$ that receive the output of the integrator 345 and whose other terminals are connected to a holding capacitor $C_H$ that is connected to the inputs of a SAR or FLASH ADC 481. State variables of the auxiliary ADC 298, e.g., the voltage of the holding capacitor $C_H$, may be reset by an auxiliary reset signal RST_B in coordination with reset of the main ADC 294 by the main reset signal RST, as described in more detail below with respect to FIGS. 5A and 5B.

Figure 5A:
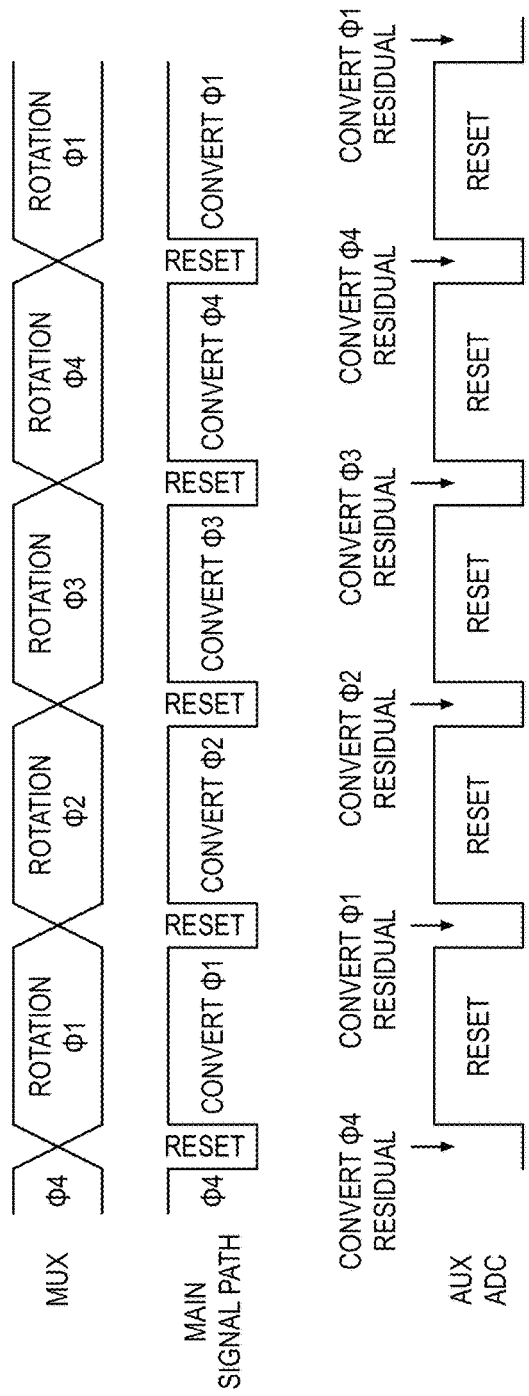
FIG. 5A is an example timing diagram illustrating operation of a DAS to acquire data from a Hall effect sensor in accordance with embodiments of the present disclosure.

FIG. 5A is an example timing diagram illustrating operation of a DAS (e.g., DAS 201/301/401 of FIG. 2, 3 or 4) to acquire data from a Hall effect sensor in accordance with embodiments of the present disclosure. The timing diagram shows three signal groups, namely signals that control the rotation of the multiplexer 106, signals related to conversion of the rotated signal and reset of state variables of the main signal path, and signals related to reset of state variables of the auxiliary ADC signal path. As shown, the multiplexer 106 operates to periodically rotate the signal from the Hall sensor 104 through four different positions for four successive intervals, or phases, shown as $\varphi 1$, $\varphi 2$, $\varphi 3$, and $\varphi 4$. During each phase, the main signal path of the DAS converts the analog signal from the Hall sensor 104 to provide the digital output value of the sensor signal. At the end of the phase, i.e., between each rotation phase, the state variables of the main signal path are reset, as shown. While the main signal path is converting the signal of the Hall sensor 104, the state variables of the auxiliary ADC 298 are reset, as shown. While the main signal path is in reset, the auxiliary ADC 298 converts the residual signal to provide the auxiliary digital output value to the combiner 397, which the combiner 397 sums with the digital output of the main ADC 294, which may be filtered by the digital filter 295 and delayed by the memory FIFO 396. More generally, the state variables are reset in synchronization with the rotation of the signal of the Hall sensor 104. In other embodiments, the number of different rotation phases may be different than four, e.g., two or eight.

Figure 5B:
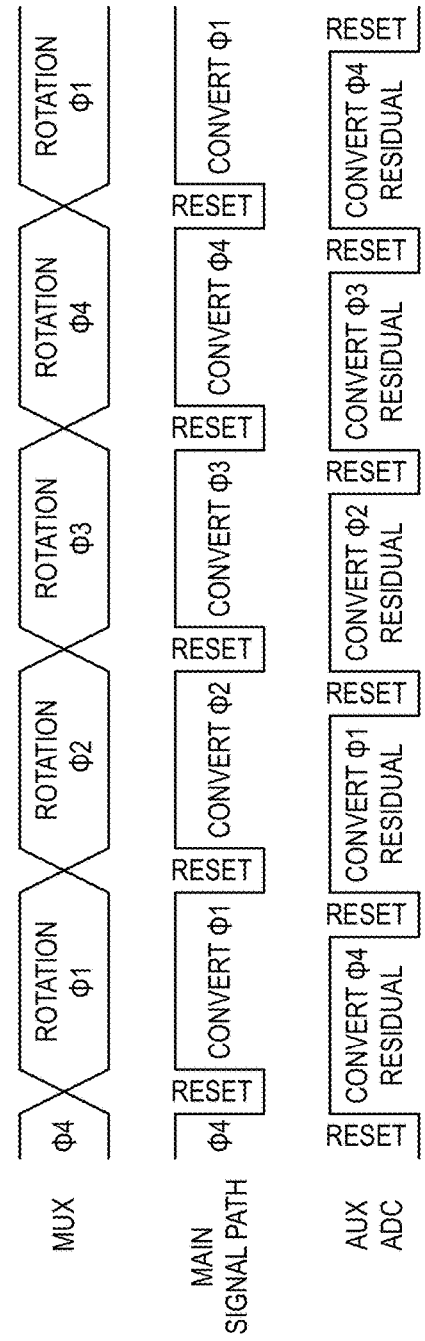
FIG. 5B is an example timing diagram illustrating operation of a DAS to acquire data from a Hall effect sensor in accordance with embodiments of the present disclosure.

FIG. 5B is an example timing diagram illustrating operation of a DAS (e.g., DAS 201/301/401 of FIG. 2, 3 or 4) to acquire data from a Hall effect sensor in accordance with embodiments of the present disclosure. The timing diagram shows three signal groups, namely signals that control the rotation of the multiplexer 106, signals related to conversion of the rotated signal and reset of state variables of the main signal path, and signals related to reset of state variables of the auxiliary ADC signal path. As shown, the multiplexer 106 operates to periodically rotate the signal from the Hall sensor 104 through four different positions for four successive intervals, or phases, shown as $\varphi 1$, $\varphi 2$, $\varphi 3$, and $\varphi 4$. During each phase, the main signal path of the DAS converts the analog signal from the Hall sensor 104 to provide the digital output value of the sensor signal. At the end of the phase, i.e., between each rotation phase, the state variables of the main signal path are reset, as shown. Just prior to the reset of the main signal path state variables, the state variables of the auxiliary ADC 298 are reset, as shown. Then, the auxiliary ADC 298 converts the residual signal to provide the auxiliary digital output value to the combiner 397, which the combiner 397 sums with the digital output of the main ADC 294, which may be filtered by the digital filter 295 and delayed by the memory FIFO 396. More generally, the state variables are reset in synchronization with the rotation of the signal of the Hall sensor 104. In other embodiments, the number of different rotation phases may be different than four, e.g., two or eight.

Figure 6:
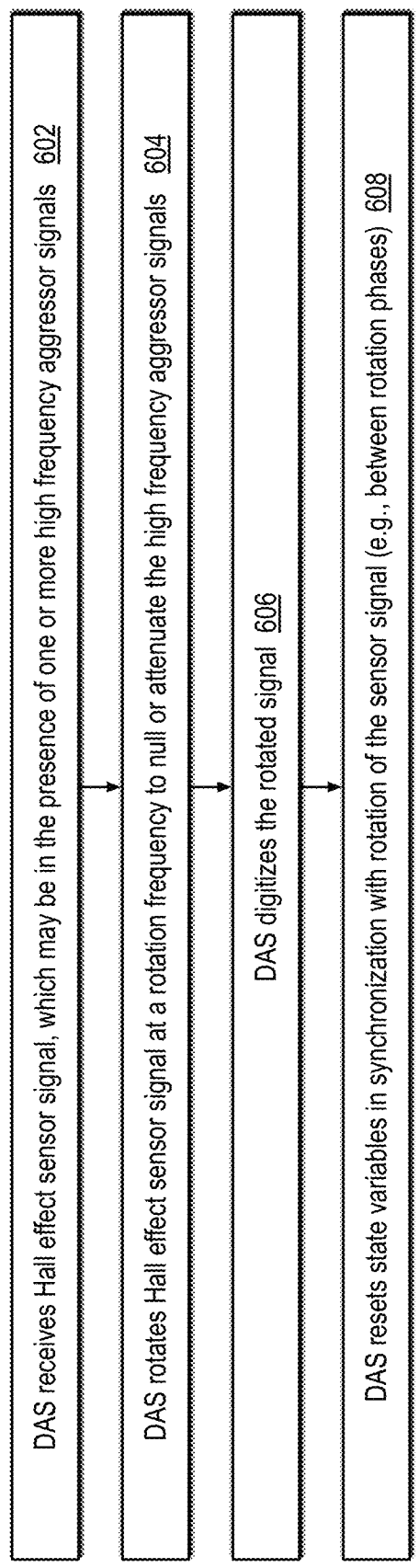
FIG. 6 is an example flowchart illustrating method of using a DAS to acquire data from a Hall effect sensor in accordance with embodiments of the present disclosure.

FIG. 6 is an example flowchart illustrating a method of using a DAS (e.g., DAS 201/301/401 of FIG. 2, 3 or 4) to acquire data from a Hall effect sensor in accordance with embodiments of the present disclosure. The operation begins at block 602.

At block 602, the DAS receives the signal from the Hall sensor. As described above, the DAS may receive the signal from the Hall sensor in the presence of high frequency aggressor signals. The operation proceeds to block 604.

At block 604, the DAS rotates the signal from the Hall sensor at a rotation frequency. The rotation by the DAS of the signal at the rotation frequency either nulls or attenuates the high frequency aggressor signals. Operation proceeds to block 606.

At block 606, the DAS digitizes the rotated signal, e.g., by ADC 294, and in some embodiments with assistance by an auxiliary ADC and/or digital filtering. Operation proceeds to block 608.

At block 608, the DAS resets one or more of the state variables in synchronization with rotation of the signal from the Hall sensor (e.g., between rotation phases). As a result, residual signals from the periodic interval of the previous rotation may be nullified. The state variables may be reset to one of different values, including but not limited to, a common mode voltage (e.g., common mode voltage $V_{cm}$ of FIG. 2, 3 or 4), a random voltage (e.g., generated by a random voltage source), a dithered voltage, a ground voltage, a predetermined direct current voltage, an alternating current sinusoidal voltage notched out by subsequent filtering, and a voltage that is uncorrelated to the sampled voltage of the rotated signal from the Hall sensor. As a result of the operation described, advantageously the values from a prior cycle minimally affect the operation of the current cycle.

Figure 7:
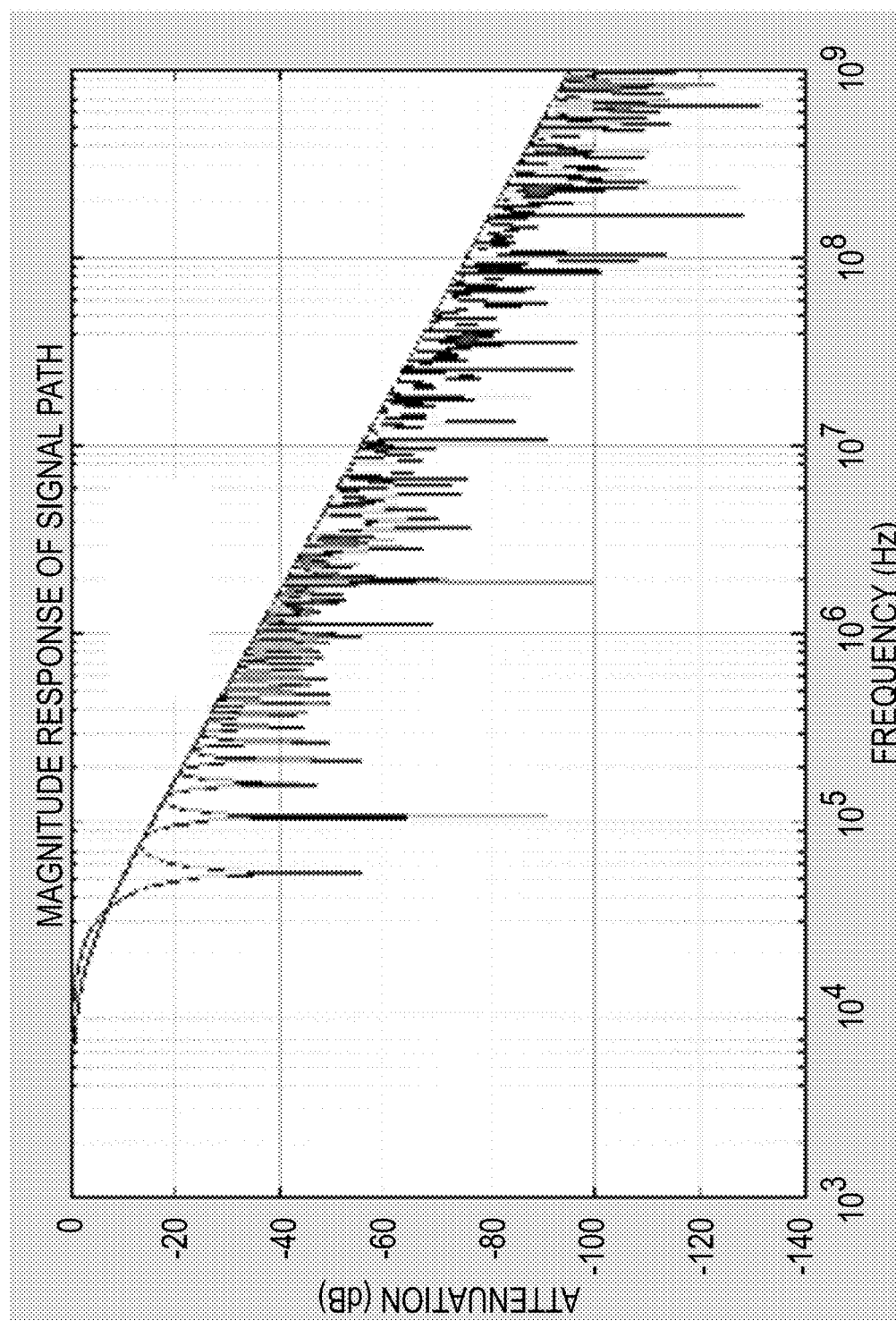
FIG. 7 is an example magnitude response graph that illustrates advantages of the operation of a DAS that resets state variables in synchronization with rotation of a Hall sensor in accordance with embodiments of the present disclosure.

FIG. 7 is a magnitude response graph that illustrates advantages of the operation of a DAS that resets state variables in synchronization with rotation of a Hall sensor in accordance with embodiments of the present disclosure. More specifically, the graph shows the attenuation by the DAS signal path in dB as a function of frequency in Hz. Consider the case mentioned above of an aggressor signal at 500 kHz differentially coupled to the output terminals of the Hall element in which the rotation rate may be set to 90 kHz. As shown in FIG. 7, the aggressor signal at 500 kHz is nulled, and the signal bandwidth (BW) around the aggressor signal is attenuated by ~30 dB. Furthermore, the harmonics of the aggressor signals are attenuated by the low pass transfer function at a rate of approximately 6 dB/Octave as shown in FIG. 7.

In conclusion, embodiments of the present disclosure provide a data acquisition system and corresponding methods for acquiring data from a Hall sensor. The DAS receives a Hall sensor signal in a presence of one or more high frequency aggressor signals. The DAS rotates the Hall sensor signal at a rotation frequency for a periodic interval that either nulls or attenuates the one or more high frequency aggressor signals. The rotated Hall sensor signal may be filtered, integrated, and/or scaled. The filtered/integrated/scaled signal is then digitized. The DAS is reset prior to a next periodic interval so that any residual signals from a previous periodic interval are nullified. The DAS outputs the digitized signal.

The amplifier may be a combination of a multi-stage amplifier, integrators, and/or filters, that are together used to further enhance the filtering nature of a data path. The ADC may be a simple incremental ADC or an auxiliary ADC assisted incremental ADC, enabling the ADC to accurately capture the signals. The ADC output may be further filtered by a digital filter to enhance the filtering nature of the data path.

Although various components of the DAS are analog devices in described embodiments, other embodiments are contemplated in which some of the components may be digital devices, e.g., a digital integrator and/or a digital low pass filter, that include state variables in the form of values stored in digital memories, rather than capacitors, that may be reset to a reset value.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Finally, software can cause or configure the function, fabrication and/or description of the apparatus and methods described herein. This can be accomplished using general programming languages (e.g., C, C++), hardware description languages (HDLs) including Verilog HDL, VHDL, and so on, or other available programs. Such software can be disposed in any known non-transitory computer-readable medium, such as magnetic tape, semiconductor, magnetic disk, or optical disc (e.g., CD-ROM, DVD-ROM, etc.), a network, wire line or another communications medium, having instructions stored thereon that are capable of causing or configuring the apparatus and methods described herein.

The invention claimed is:

1. A data acquisition system (DAS) for acquiring data from a Hall effect sensor interfered with by an expected aggressor signal having an aggressor frequency, comprising:
one or more state variables, wherein the one or more state variables comprises one or more voltages across one or more capacitors;
a multiplexer that periodically rotates a signal from the Hall effect sensor at a rotation rate, wherein the aggressor frequency is above the rotation rate; and
a controller that resets the one or more state variables at a reset frequency in synchronization with rotation of the signal, wherein to reset the one or more state variables, the controller forces the one or more voltages across the one or more capacitors to a reset voltage;
wherein a ratio of the reset frequency and the aggressor frequency is a ratio of integers such that the aggressor signal is attenuated.

2. The DAS of claim 1, wherein the reset voltage is from a list of voltages comprising:
a ground voltage;
a common mode voltage;
a random voltage;
a dithered voltage;
a predetermined direct current voltage;
an alternating current sinusoidal voltage notched out by subsequent filtering; and
a voltage that is uncorrelated to a sampled voltage of the rotated signal.

3. The DAS of claim 1, wherein at least one of the one or more capacitors are included in an interface to the Hall effect sensor.

4. The DAS of claim 1, further comprising:
a noise-shaping successive approximation register (SAR) analog-to-digital converter (ADC) or a delta-sigma ADC that digitizes the rotated signal and that comprises one or more integrators comprising at least one state variable of the one or more state variables reset by the controller.

5. The DAS of claim 1, further comprising:
a digital filter that filters a digital version of the rotated signal, wherein the digital filter comprises at least one state variable of the one or more state variables reset by the controller.

6. The DAS of claim 1, further comprising:
an integrator, a filter and/or a voltage-controlled oscillator (VCO) comprising the one or more state variables reset by the controller.

7. The DAS of claim 1, further comprising:
an incremental ADC or an auxiliary ADC-assisted incremental ADC that digitizes the rotated signal and that comprises at least one state variable of the one or more state variables reset by the controller.

8. The DAS of claim 1, further comprising:
an auxiliary analog-to-digital converter (ADC) comprising at least one state variable of the one or more state variables reset by the controller.

9. The DAS of claim 1, wherein the DAS and Hall effect sensor are DC-coupled.

10. A method for acquiring data from a Hall effect sensor interfered with by an expected aggressor signal having an aggressor frequency using a data acquisition system (DAS), comprising:
periodically rotating a signal from the Hall effect sensor at a rotation rate, wherein the aggressor frequency is above the rotation rate; and
resetting one or more state variables of the DAS at a reset frequency in synchronization with rotation of the signal;
wherein the one or more state variables comprises one or more voltages across one or more capacitors;
wherein said resetting the one or more state variables comprises forcing the one or more voltages across the one or more capacitors to a reset voltage;
wherein a ratio of the reset frequency and the aggressor frequency is a ratio of integers such that the aggressor signal is attenuated.

11. The method of claim 10, wherein the reset voltage is from a list of voltages comprising:
a ground voltage;
a common mode voltage;
a random voltage;
a dithered voltage;
a predetermined direct current voltage;
an alternating current sinusoidal voltage notched out by subsequent filtering; and
a voltage that is uncorrelated to a sampled voltage of the rotated signal.

12. The method of claim 10, wherein at least one of the one or more capacitors is included in an interface to the Hall effect sensor.

13. The method of claim 10,
wherein the DAS includes a noise-shaping successive approximation register (SAR) analog-to-digital converter (ADC) or a delta-sigma ADC that digitizes the rotated signal and that comprises one or more integrators comprising at least one state variable of the one or more state variables that are reset.

14. The method of claim 10,
wherein the DAS includes a digital filter that filters a digital version of the rotated signal, wherein the digital filter comprises at least one state variable of the one or more state variables that is reset.

15. The method of claim 10,
wherein the DAS includes an integrator, a filter and/or a voltage-controlled oscillator (VCO) comprising the one or more state variables that are reset.

16. The method of claim 10,
wherein the DAS includes an incremental ADC or an auxiliary ADC-assisted incremental ADC that digitizes the rotated signal and that comprises at least one state variable of the one or more state variables that are reset.

17. The method of claim 10,
wherein the DAS includes an auxiliary analog-to-digital converter (ADC) comprising at least one state variable of the one or more state variables that are reset.

18. The method of claim 10,
wherein the DAS and Hall effect sensor are DC-coupled.

* * * * *